(12) United States Patent
Shih

(10) Patent No.: US 7,061,040 B2
(45) Date of Patent: Jun. 13, 2006

(54) MEMORY DEVICE

(75) Inventor: Chung-Chin Shih, Jhubei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/708,666

(22) Filed: Mar. 18, 2004

(65) Prior Publication Data

US 2005/0104232 A1 May 19, 2005

Related U.S. Application Data

(63) Continuation-in-part of application No. 10/707,016, filed on Nov. 14, 2003.

(51) Int. Cl.
*H01L 29/76* (2006.01)

(52) U.S. Cl. ...................... 257/314; 257/315
(58) Field of Classification Search ......... 257/314–326
See application file for complete search history.

(56) References Cited

U.S. PATENT DOCUMENTS 6,835,987 B1* 12/2004 Yaegashi .................. 257/391

* cited by examiner

*Primary Examiner*—Douglas W Owens
(74) *Attorney, Agent, or Firm*—Jiang Chyun IP Office

(57) ABSTRACT

The present invention relates to a memory device and the fabrication method thereof. A plurality of pairs of floating gates and a plurality of pairs of select gates are formed above each active region. After forming a dielectric layer on each floating gate and on each select gate, a plurality of pairs of word lines and a plurality of pairs of source lines are formed simultaneously. The word lines and the source lines are disposed in a direction vertical to the strip active regions. A plurality of source/drain regions is disposed in the substrate beside the word lines and the source lines. After forming a thick dielectric layer over the substrate, a plurality of source line contacts are formed in the thick dielectric layer for connecting the source/drain regions that are between each pair of source lines and at least connecting one of each pair of the source lines.

21 Claims, 12 Drawing Sheets

MEMORY DEVICE

CROSS REFERENCE TO RELATED APPLICATIONS

This application is a continuation-in-part of a prior application Ser. No. 10/707,016, filed Nov. 14, 2003.

BACKGROUND OF INVENTION

1. Field of Invention

The present invention relates to a semiconductor device and the fabrication method thereof. More particularly, the present invention relates to a memory device and the fabrication method thereof.

2. Description of Related Art

The flash memory device allows multiple and repetitive writing, reading and erasure operations, and the storage data are retained even after the power supply is discontinued. Because of the aforementioned advantages, the flash memory has become the mainstream non-volatile memory device, which is widely applied in the electronic products, such as, personal computers, digital cameras and personal digital assistants (PDAs) etc.

At present, the commonly adopted flash memory cell is composed of a stacked gate consisting of a floating gate and a control gate, a source/drain region and a select transistor disposed on one side of the stacked gate. FIG. 1 is a top view illustrating a prior art flash memory structure. Referring to FIG. 1, control gate line 114b, the floating gate (not shown), select gate line 115b and the source/drain region 116 constitute the first memory cell row 150, while control gate line 114a, the floating gate (not shown), select gate line 115a and the source/drain region 116 constitute the second memory cell row 160. The first memory cell row 150 and the neighboring second memory cell row 160 share a common source line 170 that is formed in the substrate 100 and in the active region 104 between two memory cell rows 150, 160.

Since an extra doping process is performed to the active region 104 of the substrate 100 to form the source line 170, the fabrication processes become more complicated and costly. Moreover, because the source line 170 is formed in the substrate 100, the source line 170 certainly occupies a certain area in the active region of the substrate 100. Besides, for every 16 to 32 bits, a contact 180 is needed in the conventional fabrication processes for reducing the resistance of the source line 170, of which the resistance increases as the length of the source line 170 extends. The contact 180 is connected to the metal line(s) above the source line 170, thus reducing the resistance of the source line 170. As mentioned above, the prior art flash memory structure usually occupies more chip areas and hinders high integration of the device.

Furthermore, corresponding to the source line 170 in the active region 104 of the substrate 100, the isolation structures 102 are formed as rectangle blocks in the design of the above flash memory structure. However, due to many uncontrollable factors of photolithography, corner rounding often occurs to the rectangle isolation structures 102 during the photolithography process. Once misalignment happens during defining the select gate lines 115a, 115b, the select gate line 115b is shifted to the dot line position 125b (as shown in dot line), covering the rounding corners of the isolation structures 102, which causes the channel length of the select gate 115b to become longer. On the other hand, the channel length of the select gate 115a remains constant because the position of the select gate 11a is not shifted. In this case, the memory cells in different rows will have unequal electrical properties. In order to solve such problems, a predetermined distance is preserved between the corners of the isolation structures and the select gate line for keeping the select gate line away from the corners in the design of the device. Nonetheless, the distance between two adjacent memory cells is increased, leading to consuming more chip areas and preventing the device from having higher level of integration.

SUMMARY OF INVENTION

The invention provides a memory device and the fabrication method thereof, of which the source line takes less chip areas.

The invention provides a memory device and the fabrication method thereof, in which no extra contacts are required for reducing the resistance of the source line.

The invention provides a memory device and the fabrication method thereof, which avoids the problems of varying electrical properties for different memory cells, caused by corner rounding of the isolation structures.

As embodied and broadly described herein, the present invention provides a memory device disposed in the substrate. A plurality of isolation structures is disposed in the substrate, defining a plurality of active regions in the substrate. The memory device comprises a plurality of pairs of strip word lines, a plurality of first gates, a plurality of pairs of source lines, a plurality of second gates, the first, second and third dielectric layers, a plurality of source/drain regions, a plurality of source line contacts and an insulating layer. The strip word lines are, substantially parallel to one another, disposed on and in a direction vertical to the isolation structures and the active regions. The strip active regions that are covered by the plurality of the word lines are defined as a plurality of first channel regions. The first gates are disposed between the first channel regions of the substrate and the strip word lines. The first dielectric layer is disposed between the first gates and the substrate, while the second dielectric layer is disposed between the first gates and the word lines. Each pair of source lines, substantially parallel to each pair of the word lines, is disposed between each pair of word lines. The source lines are disposed in a direction vertical to the strip isolation structures and the strip active regions. The strip active regions that are covered by the source lines are defined as a plurality of second channel regions. The second gates, in strip shapes, are disposed under the plurality of the source lines and disposed on and in a direction vertical to the strip isolation structures and the strip active regions. The first dielectric layer is disposed between the second gates and the substrate, while the second dielectric layer is disposed between the second gates and the source lines. The third dielectric layer covers the word lines and the source lines. A plurality of source/drain regions is disposed in the active regions beside the word lines and the source lines. The source line contacts, through the third dielectric layer, are connected to the source/drain regions that are between each pair of the source lines, and are electrically connected to at least one of each pair of the source lines. The second gates and the source line contacts are isolated by the insulating layer.

As embodied and broadly described herein, the present invention provides a method for fabricating a memory device. A plurality of strip isolation structures is formed in a substrate to define a plurality of strip active regions in the substrate. Then, a plurality of pairs of first gate lines and a plurality of pairs of second gate lines are formed simultaneously on the substrate. Each pair of the first gates is disposed between each pair of the second gates in each strip active region. A dielectric layer is formed on each first gate and on each second gate, and a first conductive layer is formed over the substrate. The first conductive layer is defined to simultaneously form a plurality of pairs of word lines and a plurality of pairs of source lines. The word lines are disposed in a direction vertical to the strip isolation structures and the strip active regions and above the first gates, while the source lines are disposed in a direction vertical to the strip isolation structures and the strip active regions and above the second gates. A plurality of source/drain regions is formed in the substrate beside the word lines and the source lines. After forming a thick dielectric layer over the substrate, a plurality of source line contacts are formed in the thick dielectric layer for connecting the source/drain regions that are between each pair of source lines and at least connecting one of each pair of the source lines.

According to the preferred embodiments, the above memory device includes a flash memory device, while the first gate is a floating gate and the second gate is a select gate.

According to the preferred embodiments, the source line of the present invention does not occupy the chip area. Further, according to the fabrication method described in the preferred embodiments, no extra contacts are needed to reduce the resistance of the source lines. In addition, according to the fabrication method described in the preferred embodiments, the prior problems of unequal electrical properties arising from the corner rounding can be alleviated.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

FIGS. 2A–2D are top views illustrating the process steps for forming a memory structure according to preferred embodiments of the present invention. FIGS. 3A–3D are cross-sectional views illustrating the process steps for forming the memory structure of FIGS. 2A–2D along the line III—III, according to one preferred embodiment of the present invention. FIGS. 4A–4D are cross-sectional views illustrating the process steps for forming the memory structure of FIGS. 2A–2D along the line IV—IV, according to one preferred embodiment of the present invention.

Figure 1:
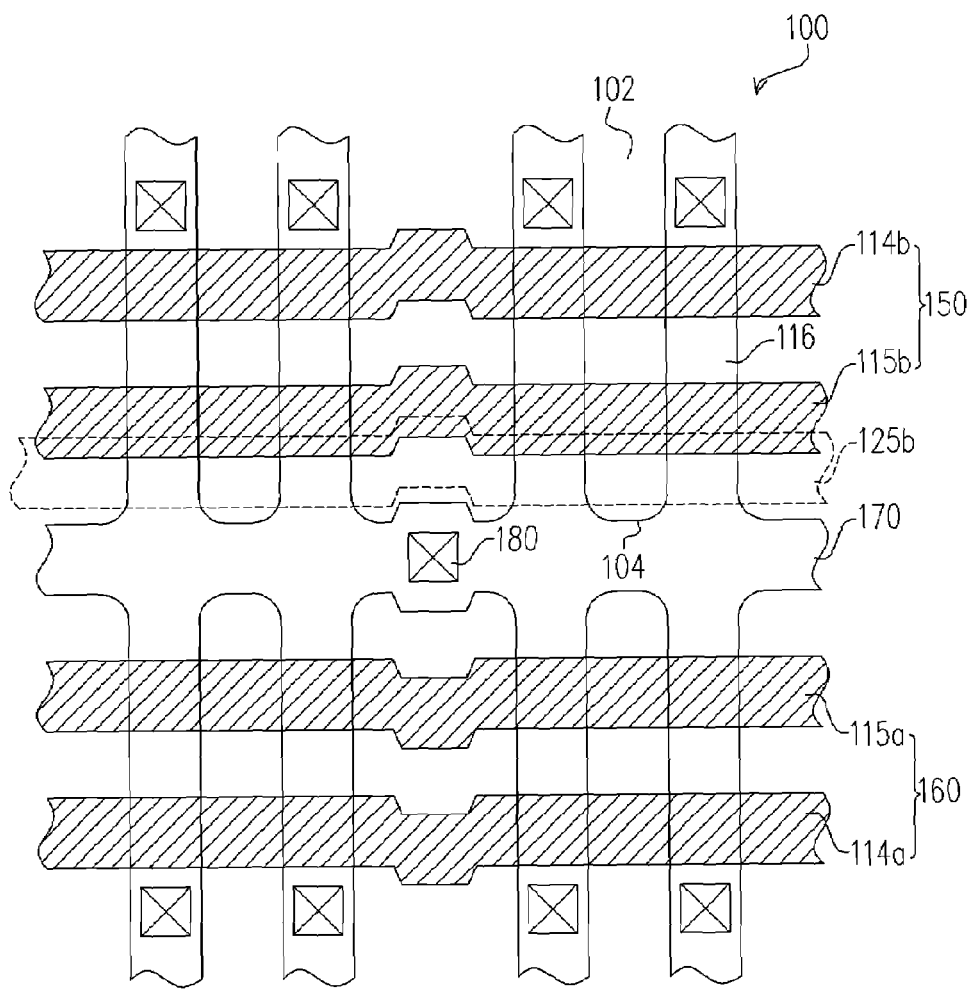
FIG. 1 is a top view illustrating a prior art flash memory structure.
Figure 2A:
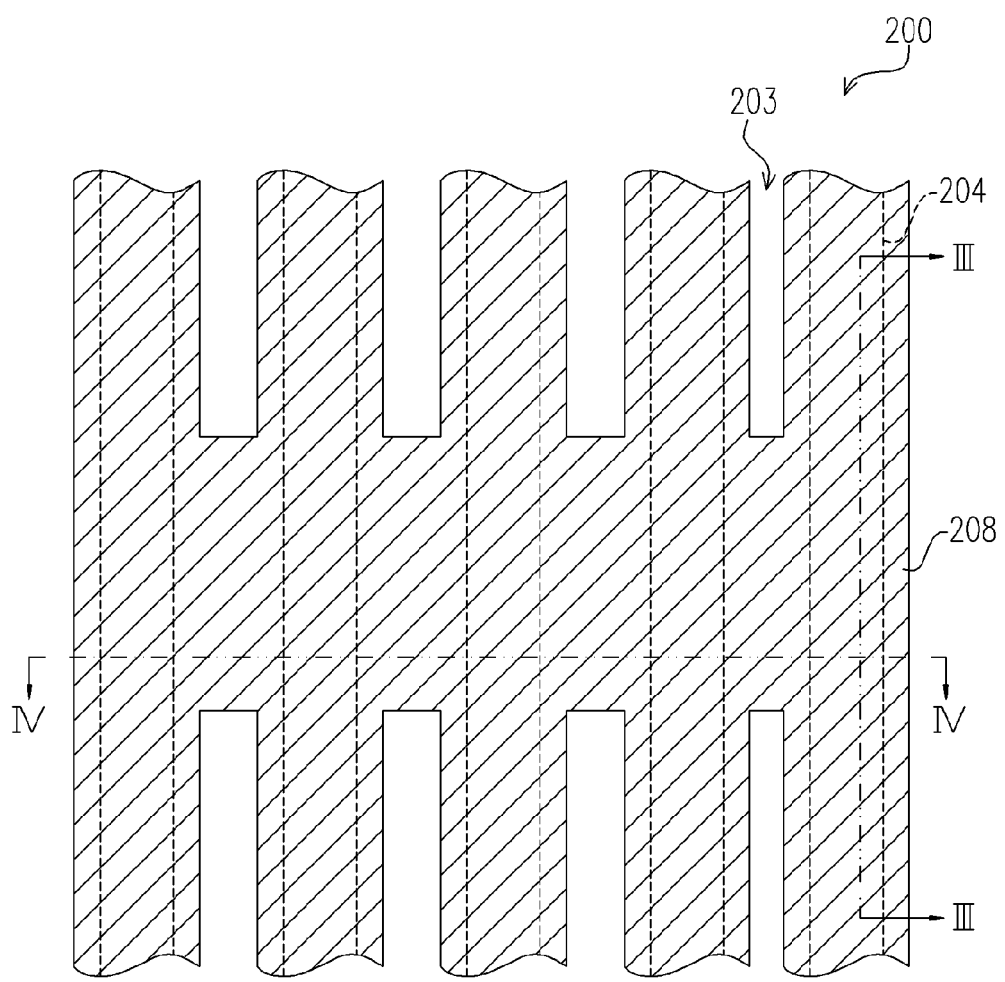
FIGS. 2A–2D are top views illustrating the process steps for forming a memory structure according to preferred embodiments of the present invention.
Figure 2B:
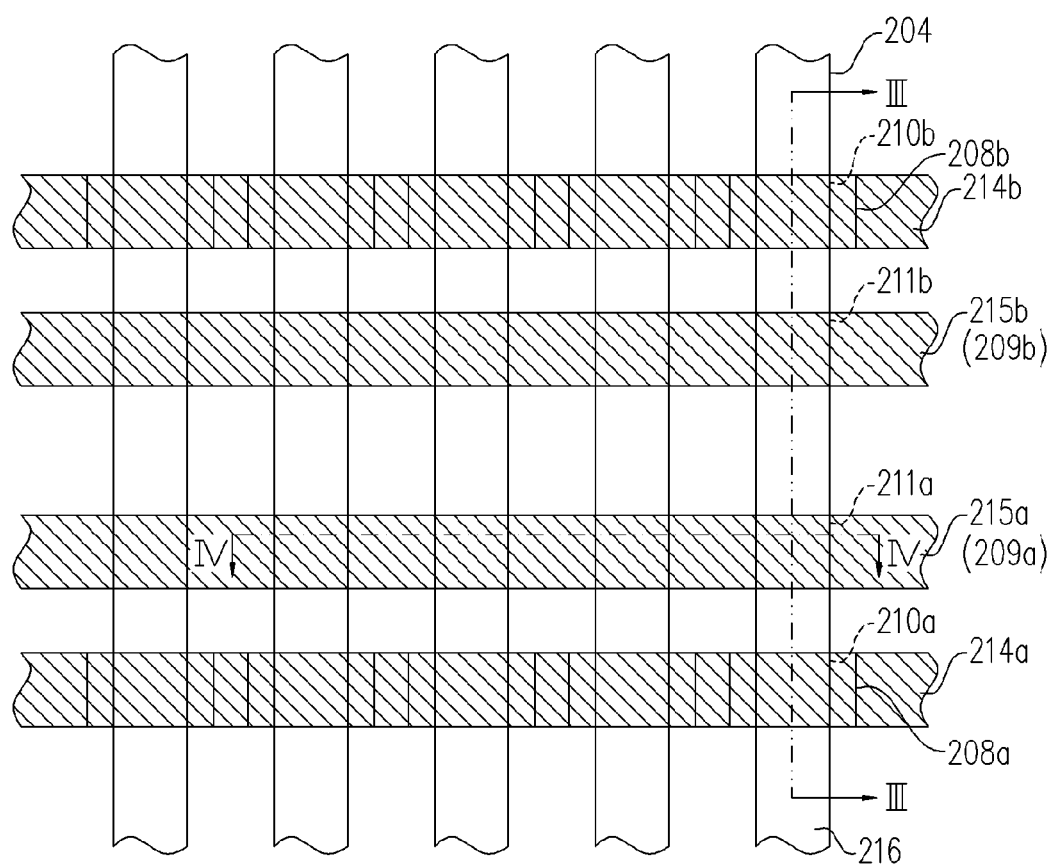
Figure 3A:
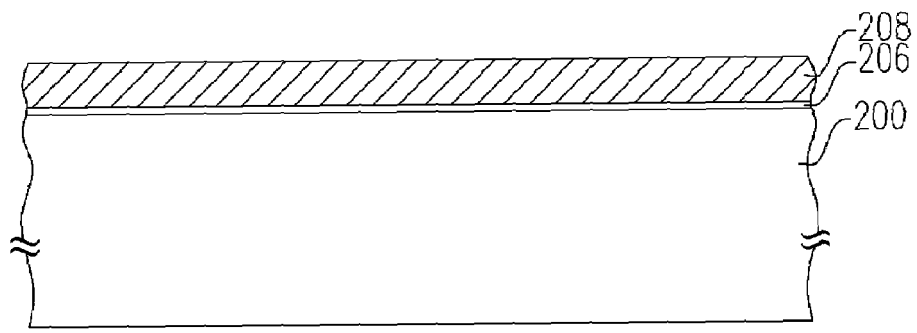
FIGS. 3A–3D are cross-sectional views illustrating the process steps for forming the memory structure of FIGS. 2A–2D along the line III—III, according to one preferred embodiment of the present invention.
Figure 3B:
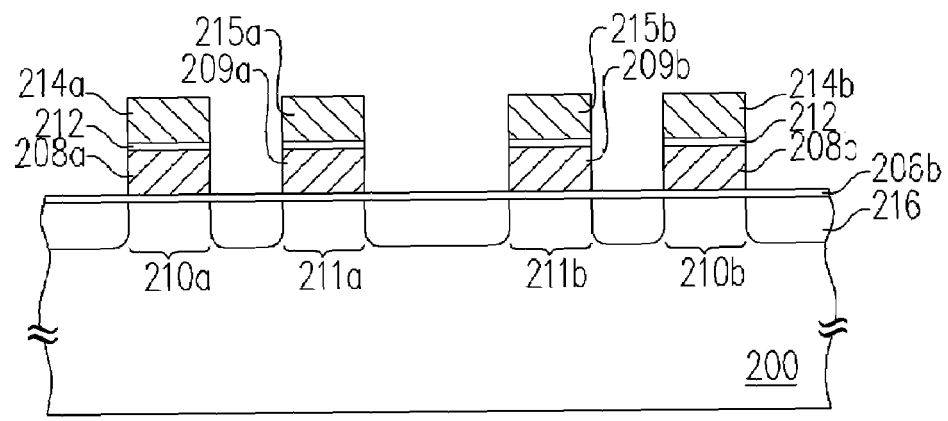
Figure 4A:
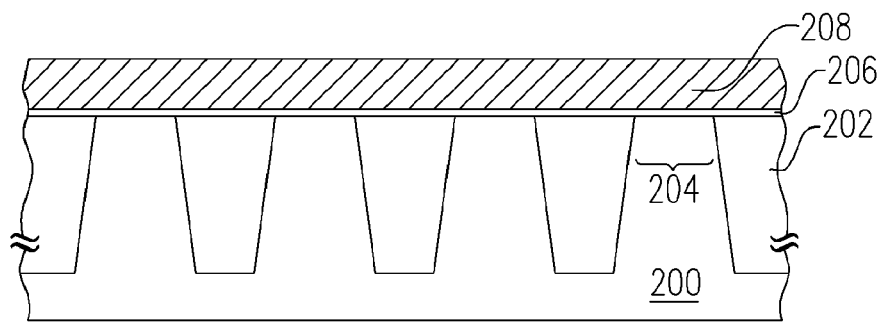
FIGS. 4A–4D are cross-sectional views illustrating the process steps for forming the memory structure of FIGS. 2A–2D along the line IV—IV, according to one preferred embodiment of the present invention.
Figure 4B:
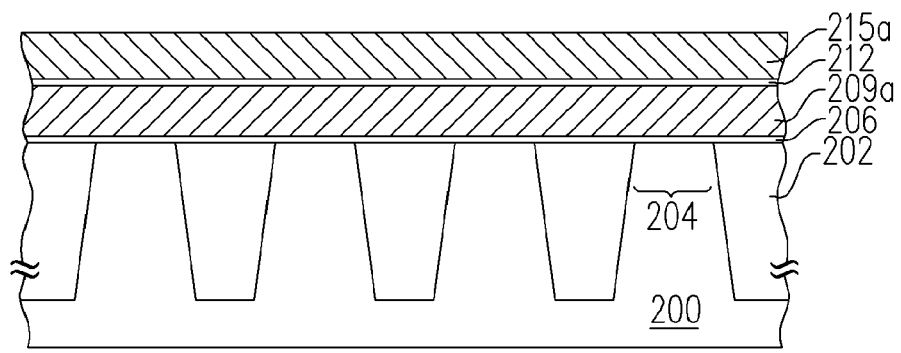

Referring to FIGS. 2A, 3A and 4A, a plurality of isolation structures 202 is formed in a substrate 200 and defines a plurality of active regions 204 in the substrate 200. The isolation structures 202 can be, for example, shallow trench isolation structures (STI). Preferably, the isolation structures 202 are in strip shapes and arranged substantially parallel to one another, so that the active regions 204 in strip shapes are defined in the substrate 200. The active regions 204 are not connected to one another. Later on, a first dielectric layer 206 is formed on the substrate 200. The material of the dielectric layer 206 can be silicon oxide formed by thermal oxidation, for example. A first conductive layer 208 is formed on the active region 204 of the substrate 200. The first conductive layer 208 can be formed by depositing a conductive material layer, for example, a polysilicon layer by chemical vapor deposition, and then patterning the conductive material layer to obtain a pattern having openings 203 by photolithography and etching.

Referring to 2B, 3B and 4B, a second dielectric layer 212 is formed over the substrate to cover the first conductive layer 208 and the first dielectric layer 206. The material of the second dielectric layer 212 can be silicon oxide, silicon oxide/silicon nitride, silicon oxide/silicon nitride/silicon oxide, or any dielectric materials having a dielectric constant higher than 8. A second conductive layer (not shown) is formed over the substrate 200 covering the second dielectric layer 212. The second conductive layer can be a composite layer of a polysilicon layer and a metal silicide layer formed by chemical vapor deposition, for example. Next, photolithography and etching are performed to pattern the second conductive layer 214 and simultaneously pattern the first conductive layers 208, exposing the first dielectric layer 206 covering the substrate 200. The second conductive layer is patterned into strip control gate lines (word lines) 214a, 214b that are substantially parallel to one another, and source lines 215a, 215b. The source lines 215a, 215b are disposed between the control gate lines 214a, 214b. In the same patterning process, the first conductive layer 208 is patterned into floating gates 208a, 208b and select gates 209a, 209b, as the first conductive layer 208 is disposed below the strip control gate lines (word lines) 214a, 214b, and the source lines 215a, 215b. The floating gates on the active regions of the same row are separated from each other by the openings 203. The active regions 204 of the substrate 200 covered by the floating gates 208a, 208b are defined as channel regions 210a, 210b, while the active regions 204 of the substrate 200 covered by the select gates 209a, 209b are defined as channel regions 211a, 211b. In accordance with one embodiment, the floating gate 208a, 208b are respectively covered on the channel regions 210a, 210b and a surrounding portion of the adjacent isolation structures 202.

In accordance with another embodiment, the floating gate 208a, 208b are respectively covered on the channel regions 210a, 210b, but not covering the adjacent isolation structures 202. Preferably, the select gates 209a(209b) is formed in a strip shape and disposed on and in a direction vertical to the channels regions 211a(211b) and the isolation structures 202 on different active regions 204.

After forming a photoresist mask (not shown) over the substrate 200, an ion implantation process is performed to form source/drain regions 216 in the substrate 200 besides the source lines 215a, 215b and the control gate lines 214a, 214b.

Figure 2C:
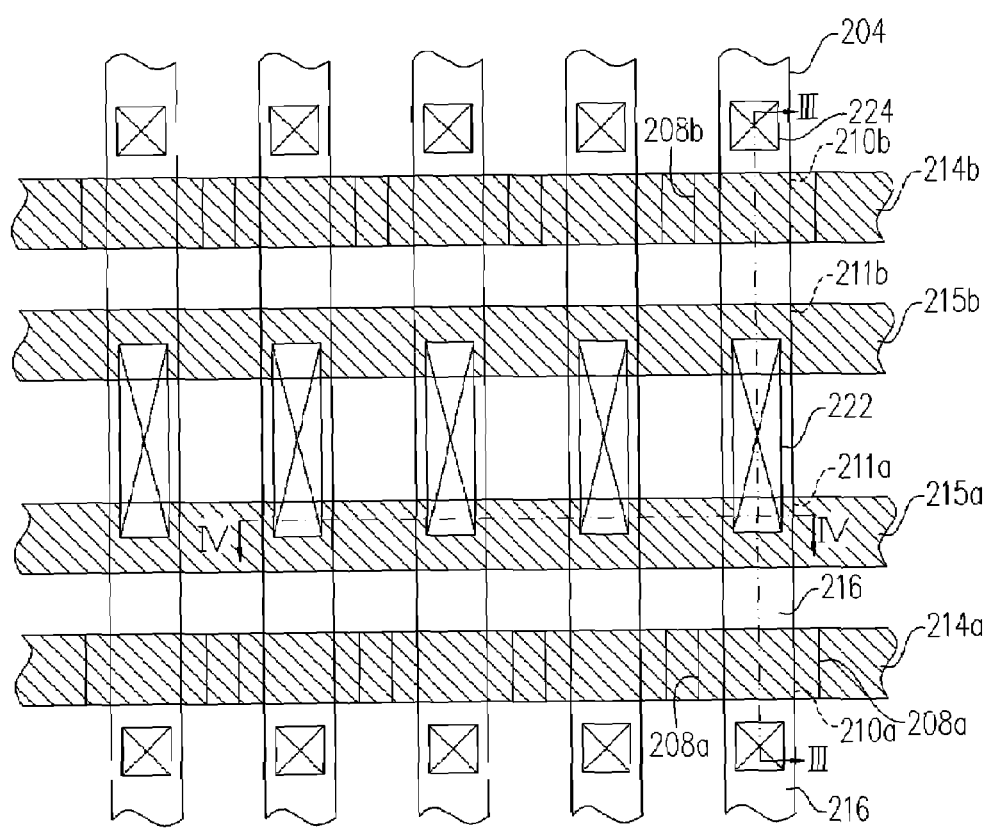
Figure 3C:
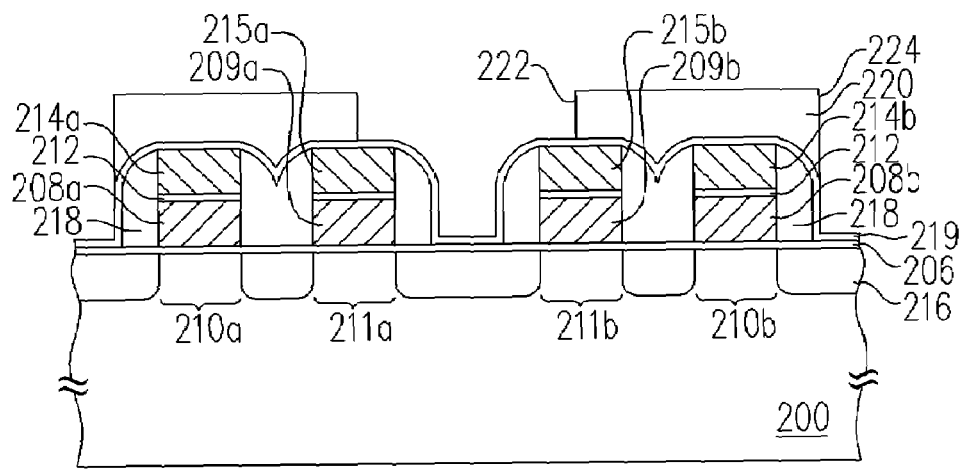
Figure 4C:
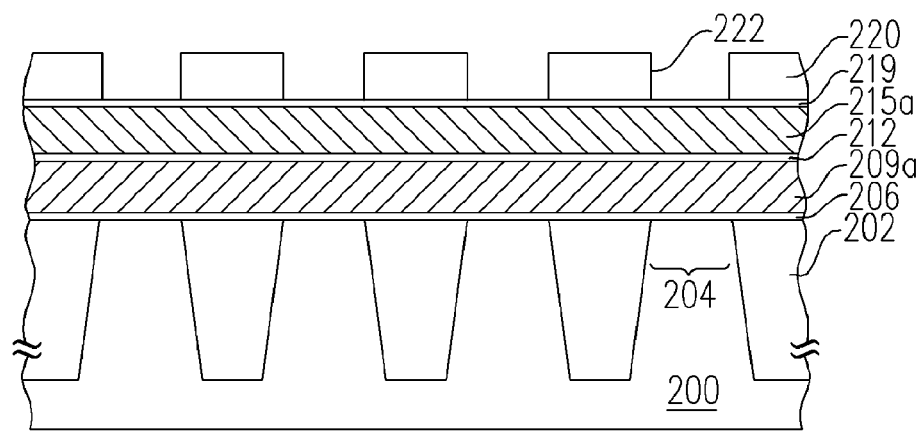

Then, referring to FIGS. 2C, 3C and 4C, a plurality of spacers 218 are formed on sidewalls of the control gate lines 214a, 214b and the source lines 215a, 215b. For example, the spacers 218 can be formed by forming a spacer material layer (not shown), such as, a silicon oxide layer, over the substrate 200 and then etching back the spacer material layer. Later on, a thick dielectric layer 220 is formed over the substrate 200. The material of the thick dielectric layer 220 can be silicon oxide formed by chemical vapor deposition, for example. Next, a plurality of source line contact openings 222 and a plurality of bit line contact openings 224 are formed in the thick dielectric layer 220. The source line contact opening 222 exposes the source/drain region 216 between two neighboring source lines 215a, 215b in the same active region 204, while the source line contact opening 222 also exposes one or both of the source lines 215a, 215b.

Figure 7:
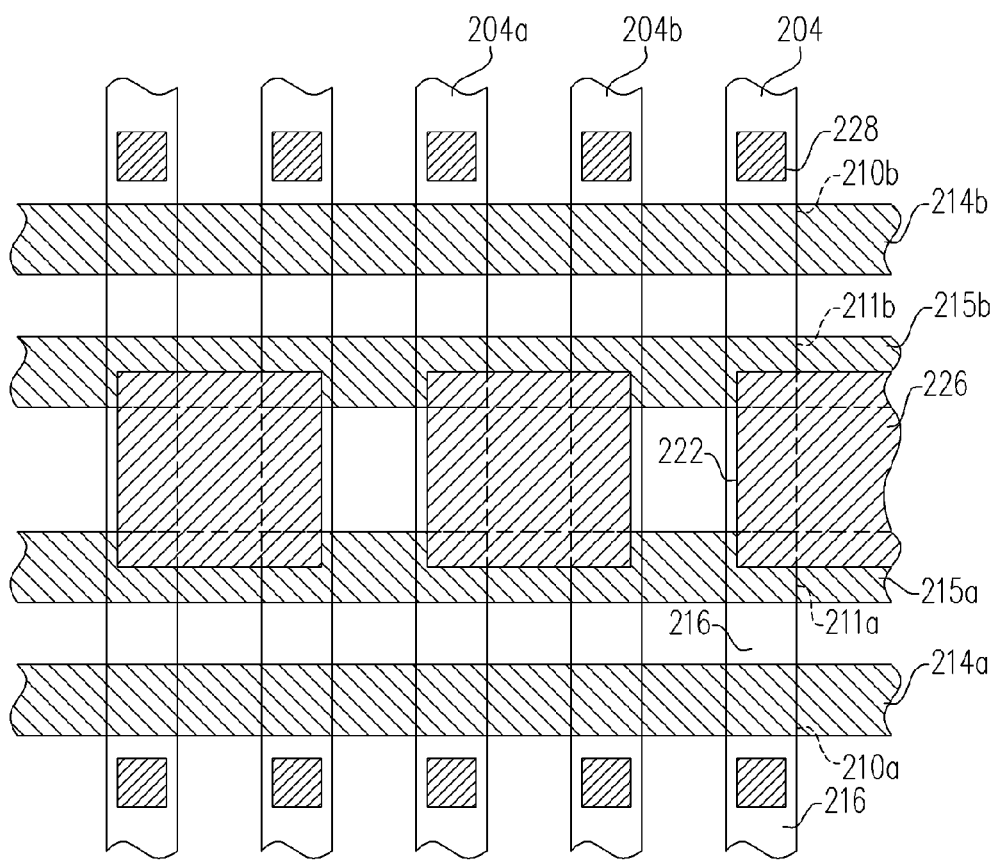
FIG. 7 is a top view illustrating the process steps for forming a memory structure according to another preferred embodiments of the present invention.

Alternatively, with reference to FIG. 7, the source line contact opening 222 can be designed to expose the source/drain regions 216 between two neighboring source lines 215a, 215b in the (two or more) adjacent active regions 204, while the source line contact opening 222 also exposes one or both of the source lines 215a, 215b. As shown in FIG. 7, the source line contact opening 222 exposes the source/drain regions 216 between two neighboring source lines 215a, 215b in two adjacent active regions 204a, 204b, while the source line contact opening 222 also exposes both of the source lines 215a, 215b. The source line contact opening 222 can be a self-aligned contact opening. The source line contact opening 222 and the bit line contact opening 224 can be formed at the same time by one single process of photolithography and etching or by two processes of photolithography and etching. Preferably, a conformal etching stop layer 219 is formed over the substrate 200 before forming the thick dielectric layer 220. The etching stop layer 219 can protect the spacers 218 from being over-etched during etching the dielectric layer 220, so as not to expose the select gate 209a, 209b.

Figure 2D:
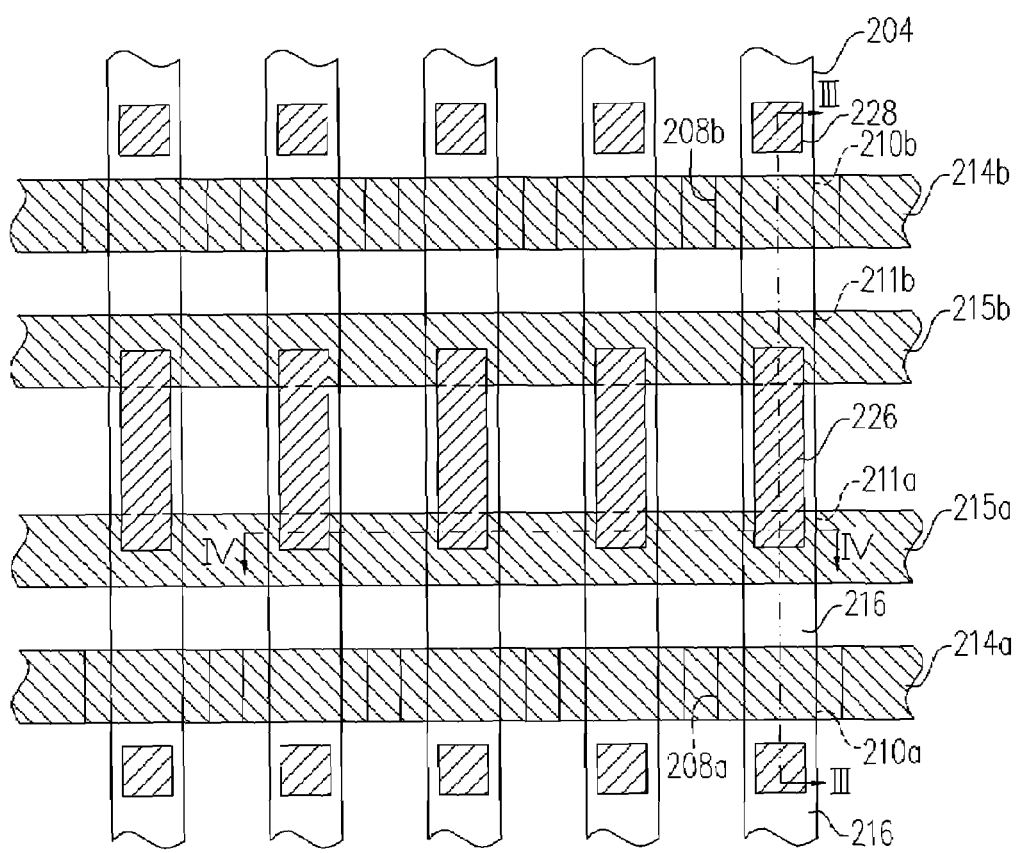
Figure 3D:
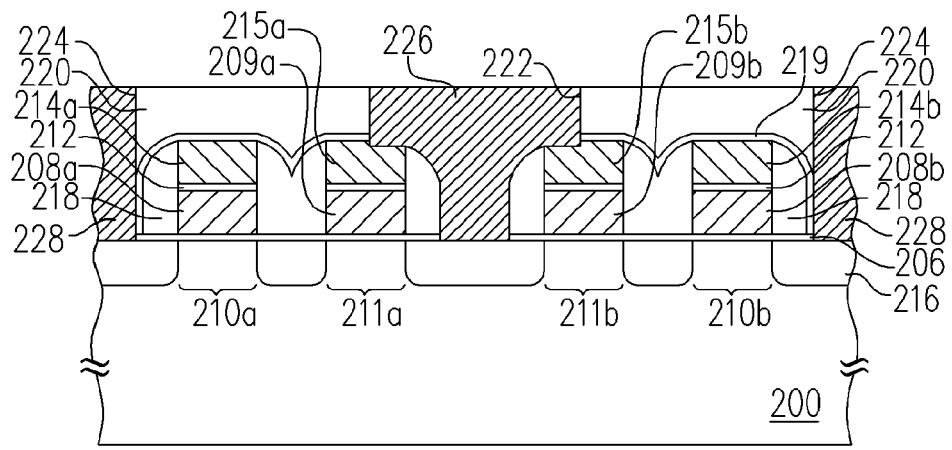
Figure 4D:
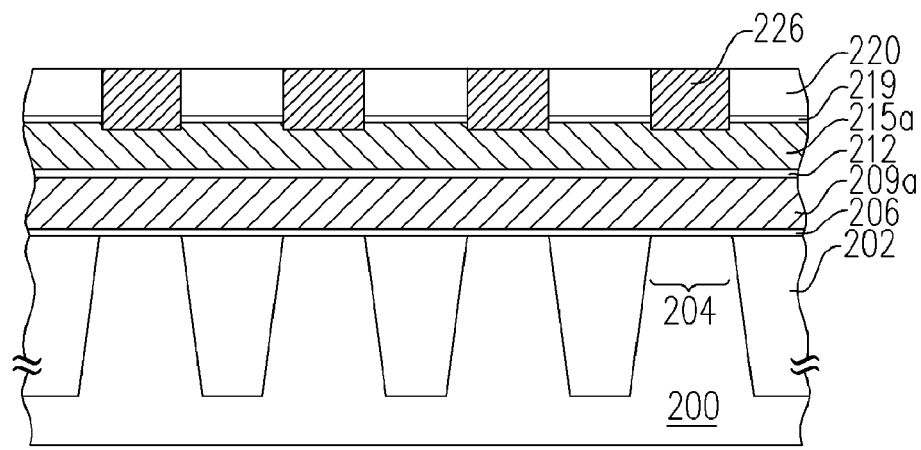

Referring to FIGS. 2D, 3D and 4D, the conformal etching stop layer 219 and the underlying dielectric layer 206 that are exposed by the source line contact opening 222 are removed to expose the source lines 215a, 215b and the source/drain region 216 in-between. Next, a conductive material is filled into the source line contact openings 222 and the bit line contact openings 224 to form source line contacts 226 and bit line contacts 228. The source line contacts 226 and bit line contacts 228 can be formed by depositing the conductive material to fill up the source line contact openings 222 and the bit line contact openings 224 after forming the dielectric layer 220 and then performing chemical mechanical polishing (CMP) or etching back to remove extra conductive material above the dielectric layer 220, for example.

In another preferred embodiment of this invention, the majority of the process steps are extensively similar to the process steps in the above preferred embodiment, except that the spacers between the source lines are removed, effectively reducing the distances between the memory cells.

FIGS. 2A–2D are top views illustrating the process steps for forming a memory structure according to preferred embodiments of the present invention. FIGS. 5A–5D are cross-sectional views illustrating the process steps for forming the memory structure of FIGS. 2A–2D along the line III—III, according to another preferred embodiment of the present invention. FIGS. 6A–6D are cross-sectional views illustrating the process steps for forming the memory structure of FIGS. 2A–2D along the line IV—IV, according to another preferred embodiment of the present invention.

Figure 5A:
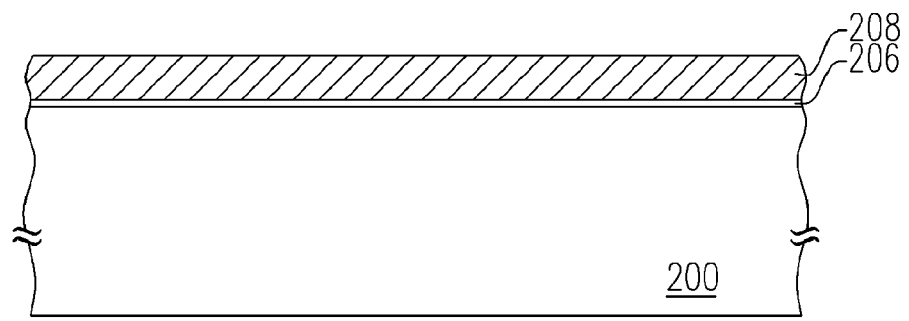
FIGS. 5A–5D are cross-sectional views illustrating the process steps for forming the memory structure of FIGS. 2A–2D along the line III—III, according to another preferred embodiment of the present invention.
Figure 5B:
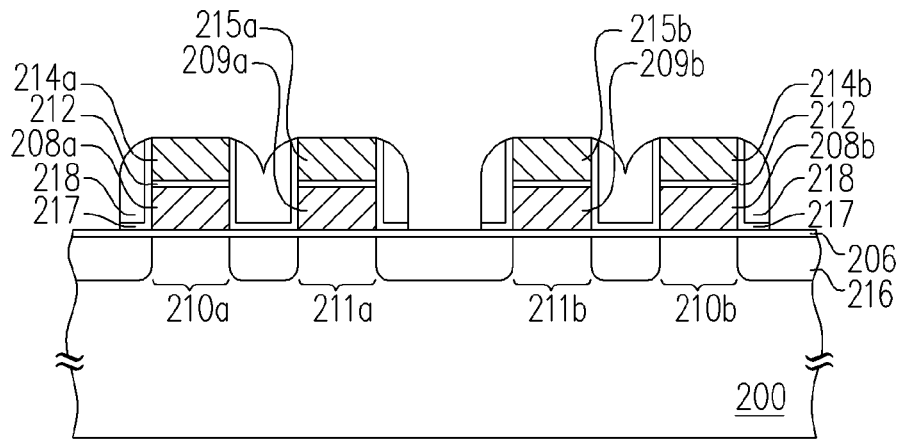
Figure 6A:
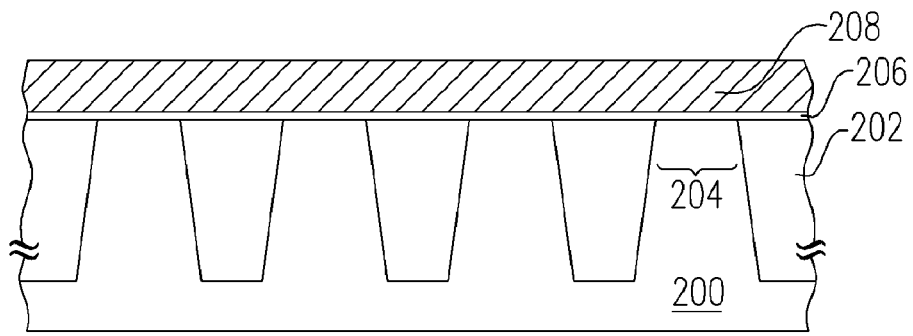
FIGS. 6A–6D are cross-sectional views illustrating the process steps for forming the memory structure of FIGS. 2A–2D along the line IV—IV, according to another preferred embodiment of the present invention.
Figure 6B:
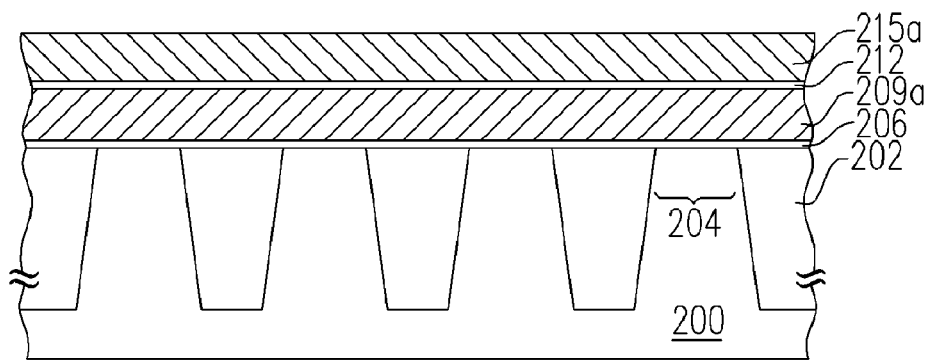

Referring to FIGS. 2A, 5A and 6A, according to the process steps mentioned in the above preferred embodiment, after a plurality of isolation structures 202 is formed in the substrate 200, a first dielectric layer 206 and a plurality of strip conductive layer 208 are formed. Referring to 2B, 5B and 6B, after forming a second dielectric layer 212, strip control gate lines (word lines) 214a, 214b and source lines 215a, 215b are formed. At the same time, the strip conductive layers 208 are patterned into floating gates 208a, 208b and select gates 209a, 209b. Afterwards, source/drain regions 216 are formed in the substrate 200.

A conformal liner layer (not shown) is formed over the substrate 200 before forming the spacers 218. After the conformal liner layer is formed over the substrate 200, a spacer material layer (not shown) is formed covering the conformal liner layer. Then, the spacer material layer is etched back until the conformal liner layer on the top surface of the control gate lines 214a, 214b and the source lines 215a, 215b is removed, to form spacers 218 and the underlying liner layer 217 on sidewalls of the control gate lines 214a, 214b and the source lines 215a, 215b. The material of the liner layer 217 is, for example, silicon nitride, different to the material of the subsequently formed thick dielectric layer 220.

Figure 5C:
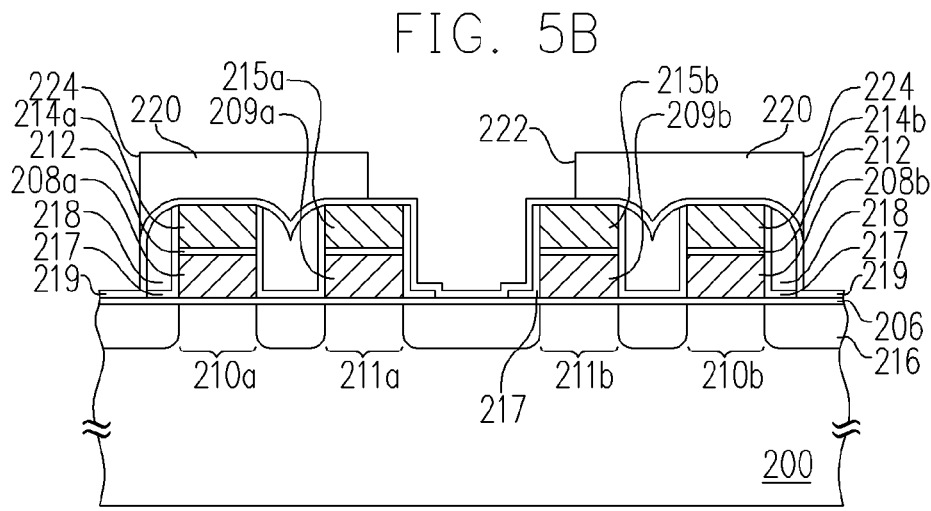
Figure 6C:
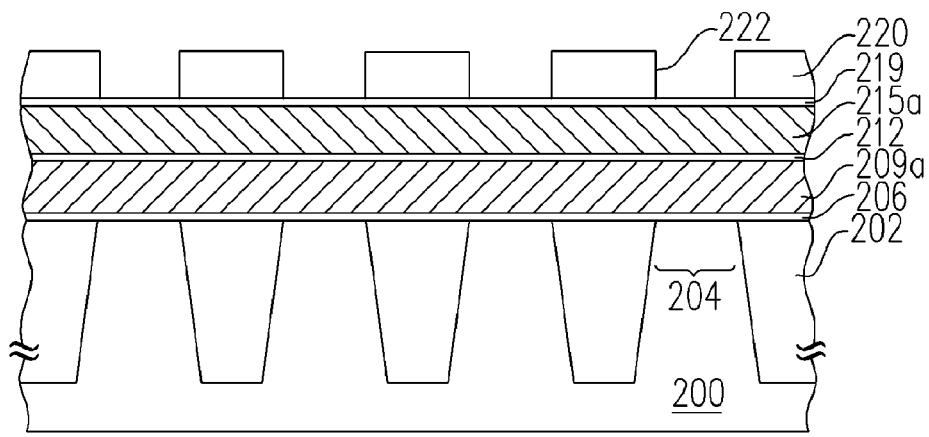

Then, referring to FIGS. 2C, 5C and 6C, the spacers 218 between the source lines 215a, 215b are removed. Later on, a thick dielectric layer 220 is formed over the substrate 200. In order to protect the liner layer 217 from being damaged during the following etching processes and protect the select gates 209a, 209b from being exposed, a conformal etching stop layer 219 is formed over the substrate 200 before forming the dielectric layer 220. After forming the dielectric layer 220, a plurality of source line contact openings 222 and a plurality of bit line contact openings 224 are formed in the thick dielectric layer 220 by photolithography and etching. Because the spacers 218 between the source lines 215a, 215b are removed, the distance between the memory cells is efficiently reduced.

Figure 5D:
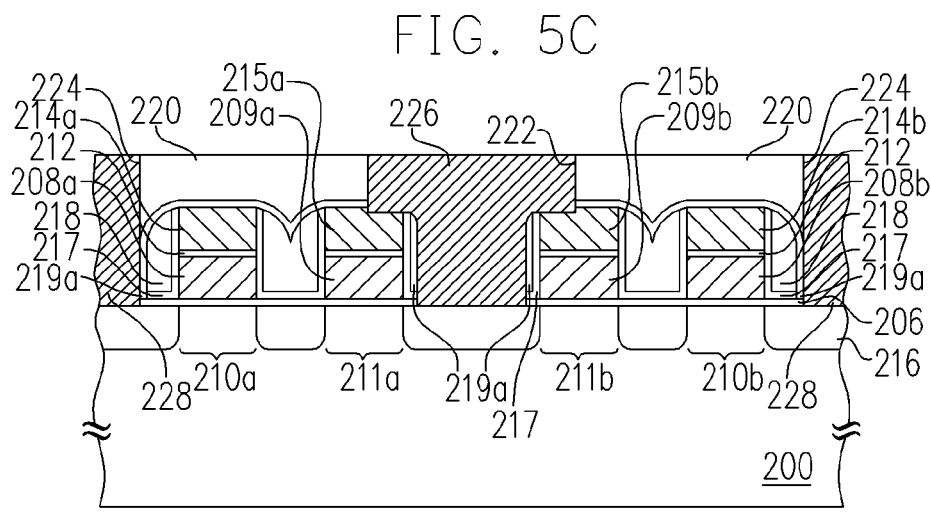
Figure 6D:
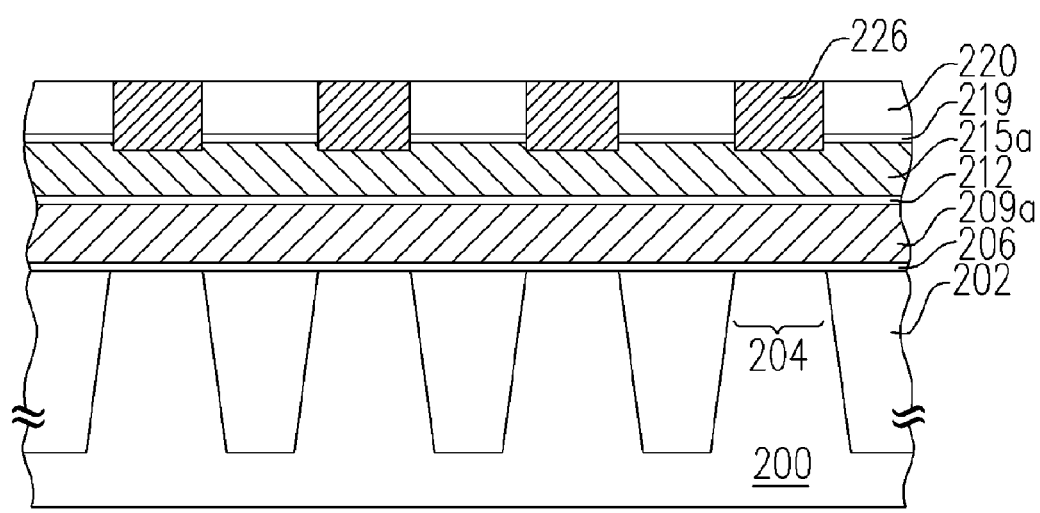

Referring to FIGS. 2D, 5D and 6D, the conformal etching stop layer 219 is etched back to expose the source lines 215a, 215b and form liner spacers 219a on the sidewalls of the source lines 215a, 215b, and the dielectric layer 206 that are exposed by the source line contact opening 222 is removed to expose the source/drain region 216 between the source lines 215a, 215b. Next, as described in the above preferred embodiment, a conductive material is filled into the source line contact openings 222 and the bit line contact openings 224 to form source line contacts 226 and bit line contacts 228.

Referring to FIGS. 2D, 3D and 4D, the memory device of the present invention is disposed in the substrate 200. A plurality of isolation structures 202 is disposed in the substrate 200, defining a plurality of active regions 204 in the substrate 200. The memory device comprises a plurality of pairs of strip control gate lines 214a, 214b, a plurality of floating gates 208a, 208b, a plurality of pairs of source lines 215a, 215b, a plurality of select gates 209a, 209b, dielectric layers 206, 212 and 220, a plurality of source/drain regions 216, a plurality of source line contacts 226 and a plurality of insulating layers 218 (according to one preferred embodiment) or a plurality of insulating layers 217 and 219a (according to another preferred embodiment, FIG. 5D). The strip control gate lines 214a, 214b are, substantially parallel to one another, disposed on and in a direction vertical to the isolation structures 202 and the active regions 204. The strip active regions 204 that are covered by the plurality of the control gate lines 214a, 214b are defined as a plurality of first channel regions 210a, 210b. The floating gates 208a, 208b are disposed between the first channel regions 210a, 210b of the substrate and the strip control gate lines 214a, 214b. The dielectric layer 206 is disposed between the floating gates 208a, 208b and the substrate 200, while the dielectric layer 212 is disposed between the floating gates 208a, 208b and the control gate lines 214a, 214b. Each pair of source lines 215a, 215b, substantially parallel to each pair of the control gate lines 214a, 214b, is disposed between each pair of control gate lines 214a, 214b. The source lines 215a, 215b are disposed in a direction vertical to the strip isolation structures 202 and the strip active regions 204. The strip active regions 204 that are covered by the source lines 215a, 215b are defined as a plurality of second channel regions 211a, 211b. The select gates 209a, 209b are disposed between the second channel regions 211a, 211b of the substrate 200 and the plurality of the source lines. The dielectric layer 206 is disposed between the select gates 209a, 209b and the substrate 200, while the dielectric layer 212 is disposed between the select gates 209a, 209b and the source lines 215a, 215b. The thick dielectric layer 220 covers the control gate lines (word lines) 214a, 214b and the source lines 215a, 215b. A plurality of source/drain regions is disposed in the active regions 204 beside the control gate lines (word lines) 214a, 214b and the source lines 215a, 215b. The source line contacts 226, through the dielectric layer 220, are connected to the source/drain regions 216 that are between each pair of the source lines 215a, 215b, and are electrically connected to at least one of each pair of the source lines 215a, 215b. The select gates 209a, 209b and the source line contacts 226 are isolated by the insulating layer 218 or the insulating layers 217a and 219a. The top surface of the source lines 215a, 215b is higher than the top surface of the select gates 209a, 209b, but is lower than or as tall as the top surface of the control gate lines 214a, 214b. The height of the top surface of source lines 215a, 215b is substantially equivalent to the height of the top surface of the control gate lines 214a, 214b.

As shown in FIG. 5D, the aforementioned memory device further comprises a plurality of spacers 218, disposed between the neighboring control gate line 214a and the source line 215a and between the neighboring control gate line 214b and the source line 215b. The thickness of each spacer 218 between the neighboring control gate line and the source line is larger than the total thickness of the four insulating layers 217 and 219a between each pair source line 215a, 215b.

Referring to FIG. 2D, the source line contact 226 is connected to the source/drain region 216 between two neighboring source lines 215a, 215b in one active region 204, while the source line contact 226 also connects one of the source lines 215a, 215b. Alternatively, as shown in FIG. 7, the source line contact 226 is connected to the source/drain regions 216 between two neighboring source lines 215a, 215b in two adjacent active regions 204a, 204b, while the source line contact 226 also connects at least one of the source lines 215a, 215b. The source line contact 226 can be a self-aligned contact.

In addition, the aforementioned memory device further comprises a plurality of bit line contacts 228, through the dielectric layer 220, are connected to the source/drain regions 216 besides each pair of control gate lines 214a, 214b. The height of the top surface of bit line contact 228 is substantially equivalent to the height of the top surface of the source line contact 226.

The aforementioned memory device employs the patterned conductive layers above the select gates as the source lines. The patterned conductive layers (source lines) level with the control gate lines and the material of the source line is the same as that of the control gate lines. The source line contact formed in the dielectric layer connects the source line and the source/drain region in the substrate. Because the source line is disposed above the select gates, the source line needs not to occupy any chip area. Further, since metal silicide of low resistance is included in the source line, it is unnecessary to form extra source line contacts in every few memory cells to reduce the resistance. Therefore, the present invention can reduce the resistance of the source line and effectively decrease the areas of the memory cells.

Furthermore, since both source lines of each pair of source lines are electrically connected to each other, the source line contact can connect to just one of each pair of source lines. Hence, the alignment window for forming the source line contact openings is increased.

Additionally, because the isolation structures of this invention are in strip shapes, the corner rounding problems can be alleviated and prior problems of unequal electrical properties for different memory cells are avoided even if misalignment occurs. The present invention needs not to preserve greater distances between the corners of the isolation structures and the select gate lines for keeping the select gate lines away from the corners. Thus, the present invention can reduce the distance between the memory cells.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A memory device, comprising:
 a plurality of isolation structures disposed in a substrate, defining a plurality of active regions in the substrate;
 a plurality of pairs of word lines, substantially parallel to one another, disposed on and in a direction vertical to the plurality of the isolation structures and the plurality of the active regions, wherein the active regions that are covered by the plurality of pairs of the word lines are defined as a plurality of first channel regions;
 a plurality of first gates disposed on the plurality of the first channel regions and between the substrate and the plurality of word lines;
 a plurality of pairs of source lines, substantially parallel to the plurality of pairs of the word lines, each pair of source lines being between each pair of word lines, wherein the plurality of the source lines are disposed in a direction vertical to the plurality of the isolation structures and the plurality of the active regions, and wherein the active regions that are covered by the plurality of pairs of the source lines are defined as a plurality of second channel regions;

a plurality of second gates disposed on the plurality of the second channel regions and between the substrate and the plurality of the source lines;

a first dielectric layer disposed between the plurality of the active regions and the plurality of the first gates, and between the plurality of the active regions and the plurality of the second gates;

a second dielectric layer disposed between the plurality of the word lines and the plurality of the first gates, and between the plurality of the source lines and the plurality of the second gates;

a third dielectric layer disposed over the substrate and covering the plurality of the word lines and the plurality of the source lines;

a plurality of source/drain regions disposed in the active regions beside the first gates and the second gates;

a plurality of source line contacts, through the third dielectric layer, connecting to the source/drain regions that are between each pair of the source lines and electrically connecting to at least one of each pair of the source lines; and a plurality of insulating layers disposed between the plurality of the second gates and the plurality of the source line contacts.

2. The memory device of claim 1, wherein the plurality of the isolation structures, substantially parallel to one another, are disposed in the substrate and are in strip shapes, thus defining the plurality of active regions in strip shapes.

3. The memory device of claim 1, wherein a height of the source lines disposed above the second gates is between a height of the second gates and a height of the word lines.

4. The memory device of claim 3, wherein the height of the source lines disposed above the second gates is substantially the same as the height of the word lines.

5. The memory device of claim 1, wherein a material of the source lines is the same as that of the word lines.

6. The memory device of claim 1, wherein a material of the source lines includes polysilicon and metal suicide, while a material of the word lines includes polysilicon and metal suicide.

7. The memory device of claim 1, further comprising a plurality of spacers, disposed between the word lines and the source lines neighboring to the word lines, and wherein a thickness of the insulating layer between the second gate and the source line contact is smaller than a half of a thickness of the spacer.

8. The memory device of claim 1, wherein each source line contact connects to one source/drain region in one active region between each pair of the source lines and connects to at least one of each pair of the source lines.

9. The memory device of claim 1, wherein each source line contact connects to at least two source/drain regions in at least two adjacent active regions between each pair of the source lines and connects to at least one of each pair of the source lines.

10. The memory device of claim 1, wherein each source line contact is a self-aligned contact.

11. The memory device of claim 1, further comprising a plurality of bit line contacts, through the third dielectric layer, connecting the source/drain regions beside each pair of the word lines, and wherein a height of the bit line contacts is substantially the same as a height of the source line contacts.

12. The memory device of claim 1, wherein when the memory device is a flash memory device, the first gate is a floating gate and the second gate is a select gate.

13. A memory device, disposed in a substrate, the memory device comprising a plurality of pairs of word lines, a plurality of pairs of source lines and a plurality of source/drain regions, wherein the memory device is characterized in that:

each pair of source lines, substantially parallel to each other and electrically connected to each other, is disposed between each pair of word lines, and the source/drain regions are disposed between each pair of source lines and between the source lines and the adjacent word lines, the word lines, the source lines and the source/drain regions are covered by a dielectric layer; and a plurality of source line contacts, through the third dielectric layer, is further included, connecting to at least one of the source/drain regions that are between each pair of the source lines and electrically connecting to at least one of each pair of the source lines, wherein the memory device is further characterized in that: a plurality of isolation structures is disposed in the substrate and is in strip shapes, thus defining a plurality of active regions in strip shapes in the substrate, and each source line contact connects to at least two source/drain regions in at least two adjacent active regions between each pair of the source lines and connects to at least one of each pair of the source lines.

14. The memory device of claim 13, wherein a height and a contour of the source lines are substantially equivalent to a height and a contour of the word lines.

15. The memory device of claim 14, further comprising:

a plurality of first gates, disposed between the substrate and the word lines;

a plurality of second gates, disposed between the substrate and the source lines;

a first dielectric layer, disposed between the substrate and the plurality of the fist gates and between the substrate and the plurality of the second gates; and a second dielectric layer, disposed between the plurality of the fist gates and the ward lines and between the source lines and the plurality of the second gates.

16. The memory device of claim 15, wherein when the memory device is a flash memory device, the first gate is a floating gate and the second gate is a select gate.

17. The memory device of claim 13, wherein a material of the source lines is the same as a material of the word lines.

18. The memory device of claim 17, wherein the material of the source lines includes polysilicon and metal silicide, while the material of the word lines includes polysilicon and metal silicide.

19. The memory device of claim 13, wherein the memory device is further characterized in that:

a plurality of isolation structures is disposed in the substrate and is in strip shapes, thus defining a plurality of active regions in strip shapes in the substrate; and each source line contact connects to one source/drain region in one active region between each pair of the source lines and connects to at least one of each pair of the source lines.

20. The memory device of claim 13, wherein each source line contact is a self-aligned contact.

21. The memory device of claim 13, further comprising a plurality of bit line contacts, through the third dielectric layer, connecting the source/drain regions beside each pair of the word lines, and wherein a height of the bit line contacts is substantially the same as a height of the source line contacts.

* * * * *